United States Patent [19]

Nagami

[11] Patent Number: 4,570,242
[45] Date of Patent: Feb. 11, 1986

[54] DYNAMIC RANDOM-ACCESS MEMORY

[75] Inventor: Akira Nagami, Tokyo, Japan

[73] Assignee: Nippon Electric Co., Ltd., Tokyo, Japan

[21] Appl. No.: 436,991

[22] Filed: Oct. 27, 1982

[30] Foreign Application Priority Data

Oct. 27, 1981 [JP] Japan .................................. 56-171684

[51] Int. Cl.⁴ ............................................... G11C 11/40
[52] U.S. Cl. ...................................... 365/222; 365/182
[58] Field of Search ................................ 365/222, 182

[56] References Cited

U.S. PATENT DOCUMENTS

4,334,295 6/1982 Nagami ................................ 365/223

Primary Examiner—Joseph A. Popek
Attorney, Agent, or Firm—Laff, Whitesel, Conte & Saret

[57] ABSTRACT

A dynamic memory is capable of performing an internal charge storing refreshing operation with a low power consumption. The memory comprises an inverter for receiving a signal from the outside. The inverter is composed of an input transistor and a load circuit whose ability to feed a current to the input transistor is controllable and is made smaller during the internal refresh operation.

17 Claims, 13 Drawing Figures

DYNAMIC RANDOM-ACCESS MEMORY

BACKGROUND OF THE INVENTION

1. Field of the Invention

The present invention relates to a dynamic random-access memory constituted by employing insulated-gate field-effect transistors.

2. Description of the Prior Art

Having such a great merit because a large capacity is available and the power consumption is low, dynamic random-access memories are widely utilized.

The stored data is maintained in the form of a preservation of an electric charge in each of a plurality of memory cells, e.g., the preservation of the electric charge is stored in a capacitor, in such D-RAMs; hence, the stored data disappears with the elapse of time. Therefore, it is necessary to effect a refreshing operation so that, after data is written into each memory cell, the data is rewritten within a maximum period of time and, thus, the data can be maintained without disappearing. In D-RAMs of a general matrix arrangement where each memory cell is disposed at the intersection between a word line and a digit line, refreshing is performed per word line, so that a single refreshing causes the contents of all the memory cells coupled to a word line to be simultaneously refreshed. Accordingly, the word line address is called the refresh address. Because of the need for such refreshing, all the refresh addresses must be refreshed in a cycle of a given refresh interval (2 mS in general).

A means for refresh control is, therefore, provided on the board system equipped with a memory IC. Employed for the refresh control are generally 5 to 6 ICs for constituting a refresh timing generator and the like. Consequently, although it is possible to neglect the space occupied by the refresh control means, in case of a large-sized board system, the rate of occupation by the refresh control means increases as the system becomes smaller in size, resulting in a decrease in the packaging efficiency. Consequently, dynamic RAMs have been proposed so that the refresh function part is incorporated into a memory chip. A refresh control clock signal (referred to at "$\overline{\text{RFSH}}$" hereinafter) is provided as an external input pin so that feeding the clock according to the prescribed conditions permits refreshing to be automatically effected inside the chip. Such memories are also called quasi-static RAMs since they can be handled in the same manner that static RAMs are handled as long as the $\overline{\text{RFSH}}$ input conditions are maintained.

In the RAMs, the refresh address designated by the internal refresh adress counter is refreshed by making the $\overline{\text{RFSH}}$ low, without employing any address from the outside. The refreshing is continously performed with respect to different refresh addresses by making the refresh address counter incremental in order as long as the $\overline{\text{RFSH}}$ is low. However, the supply current required for internal refreshing is several mA, which is a large value considering that the RAM is backed up by means of a battery. Consequently, it is difficult to constitute a system having a memory backup function by employing such a quasi-static RAM.

SUMMARY OF THE INVENTION

It is, therefore, an object of the invention to provide a dynamic random-access memory having a greatly reduced power consumption during internal refreshing.

Another object of the invention is to provide a dynamic random-access memory which is capable of easily backing up the memory content by means of a battery.

Still another object of the invention is to reduce the supply current during self-refreshing so that it becomes smaller than the standby supply current as well as to provide a circuit system for reducing power consumption, for realizing the above.

The gist of the invention is that the primary portion of the DC current, supplied during self-refreshing, is generated in an input circuit for receiving control signals from the outside. The DC current in this portion is suppressed to such an extent that it can carry out self-refreshing.

According to the invention, the current supply capability of a load of the input circuit for receiving control signals from the outside is increased during a memory cycle and pulse refreshing, but current requirements are small during self-refreshing. In the invention, therefore, a first load circuit having a small current supply capability and a second load circuit having a large current supply capability are provided in parallel as a load of the input circuit. The first load circuit is constantly operated, while the second load circuit is energized during a memory cycle and/or pulse refreshing. In this case, the first load circuit should have a small current supply capability which is enough to carry out self-refreshing at a low speed. The second load circuit is provided with a large current supply capability which is enough to carry out a memory cycle at a high speed.

By such an arrangement, the invention permits the general memory cycle to be performed at a high speed and self-refreshing to be effected at a small current which is below the conventional memory standby current. Accordingly, it becomes easier to back up the memory storage content by means of a battery.

According to a preferred embodiment of the invention, there is a dynamic memory having a refresh control clock signal used at an external pin input clock. The dynamic memory is handled equally to a static memory so that when the clock signal is held active for more than a prescribed period of time, an automatic refresh starts within the RAM. The refreshing operation is performed in a cycle of a given time during the period under the control of a built-in timer circuit. A refresh address counter enables all memory cells to be automatically refreshed, and is effective to use in a power down mode while the value of an average supply current is sufficiently smaller than the value of the standby supply current during the general memory cycle. As compared to the current capability during the other periods, this current reduction occurs because the current capability of the inverter load transistor consuming DC current is lower during the period extending from the starting of the refreshing operation actuated by the timer circuit to the return of the refresh control clock to an inactive state.

DESCRIPTION OF THE PREFERRED EMBODIMENT

Figure 1:
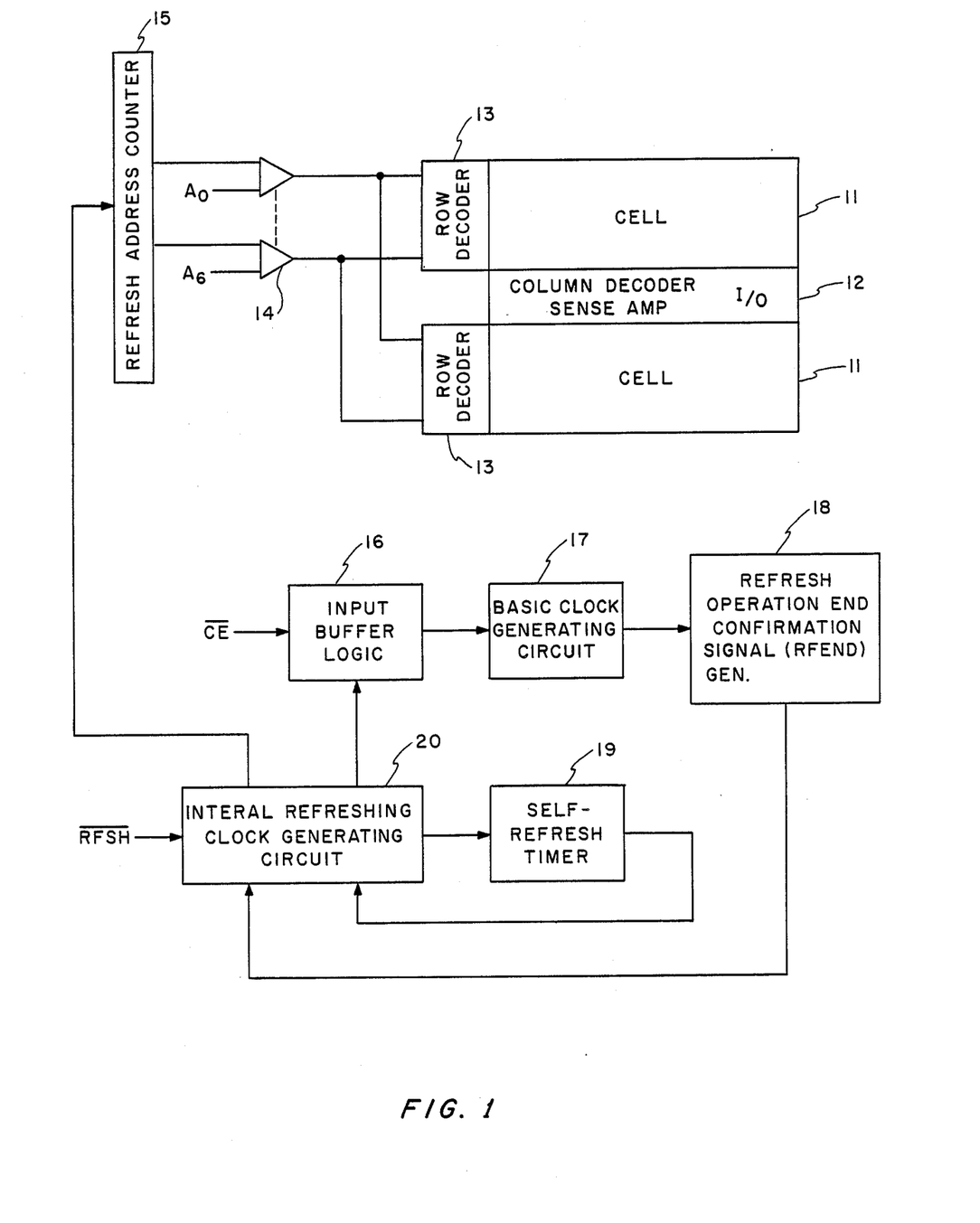
FIG. 1 is a block diagram of a dynamic RAM (quasi-static RAM) circuit having an internal refreshing function.

The arrangement of the present quasi-static RAM is featured by refreshing and will be described hereinunder with reference to FIG. 1. An external input clock $\overline{CE}$ ("chip enable") is a basic clock, and when it is activated a read-write memory cycle is started. Namely, when the clock $\overline{CE}$ shifts from high level to low level, the RAM becomes an active state so that a read-write cycle may start. In response to timing drive signals successively generated from a basic clock generating circuit 17, row address inverter buffers 14 are first actuated in accordance with external input addresses $A_0$–$A_6$ to determine the logic of each of the addresses. Then, in response to this actuation, a row decoder 13 is selected. The level of the selected word line in a cell region 11 corresponding to the input address rises in response to the decoder buffer drive timing signal. A sense amplifier (12) is activated, and all the cells on the selected word line are refreshed.

After the sense amplifier operation is substantially completed, the digit line of the selected cell is connected to a data input/output bus by a column decoder (12) for performing either a reading or writing operation with respect to the selected cell. In other words, during the general memory cycle, a reading or writing of the selected cell is effected in the cells on the word line corresponding to the external input row address. The $\overline{RFSH}$ signal is generally maintained inactive, i.e., a high level during the memory cycle. On completion of the memory cycle, i.e., on completion of reading or writing, and after a reset pre-charge operation is sufficiently performed, internal refreshing is started in response to the $\overline{RFSH}$ signal.

Figure 2:
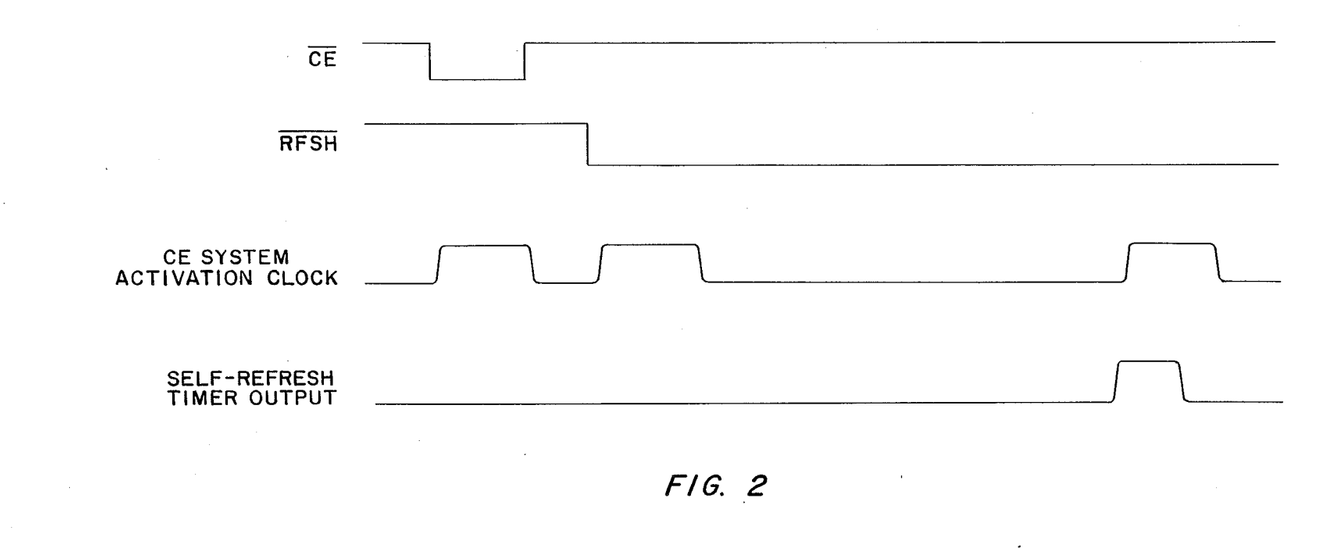
FIG. 2 illustrates two kinds of operation mode of internal refreshing, i.e., pulse refreshing and self-refreshing.

The internal refreshing has two kinds of operation modes, which are shown in FIG. 2. Started in response to the change of $\overline{RFSH}$ from high level to low level is pulse refreshing. An internal refreshing clock generating circuit 20 shown in FIG. 1 is activated to transmit the content of a refresh address counter 15 to the inputs of the row address inverter buffers 14 as well as cause to an input buffer control logic part 16 to actuate a basic clock generating circuit 17.

At this time, the external addresses are cut off from the row address inverter buffer 14, which operates in response to the refresh address counter 15, acting as an input device. Similar to the above, after the cells on the selected word line are refreshed, the internal refreshing clock generating circuit 20 is reset in response to the rise of a refreshing operation end confirming signal (referred to as "RFEND" hereinafter). Moreover, the content of the refresh address counter 15 is incremental. The basic clock generating circuit 17 is reset through the input buffer control logic circuit 16, and the whole of the circuit is shifted to a reset/pre-charge state.

The other internal refreshing is self-refreshing obtained when $\overline{RFSH}$ is kept at a low level for more than a prescribed period of time, as shown in FIG. 2. The self-refreshing timer 19 shown in FIG. 1 is preset during the active period of the internal refreshing to automatically measure the time after the reset/pre-charge state is established in response to RFEND. After the time measured by the timer 19 has passed, the self-refreshing timer output rises, causing the internal refreshing clock generating circuit 20 to be brought to an active state. As a result, the cells on the word line designated by the refresh address counter 15 are refresh in a similar manner to the above.

Figure 3:
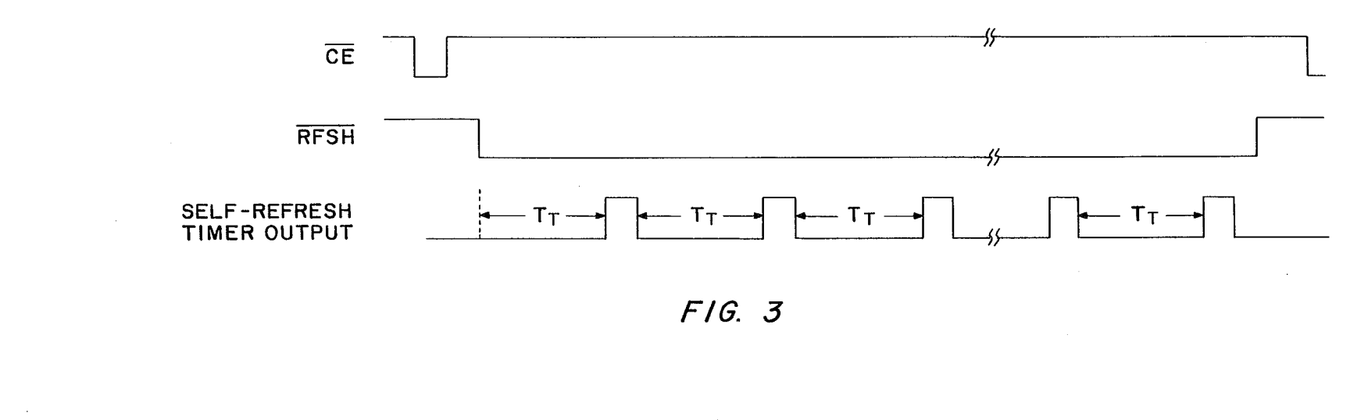
FIG. 3 further practically illustrates self-refreshing.

On completion of the refreshing operation, RFEND rises, causing the circuit to be automatically returned to the reset/pre-charge state, and the timer which is already preset is actuated. In other words, such an operation is repeated as long as $\overline{RFSH}$ is kept at a low level, as shown in FIG. 3. Self-refreshing is continuously performed at intervals of the timer time $T_T$.

Figure 4:
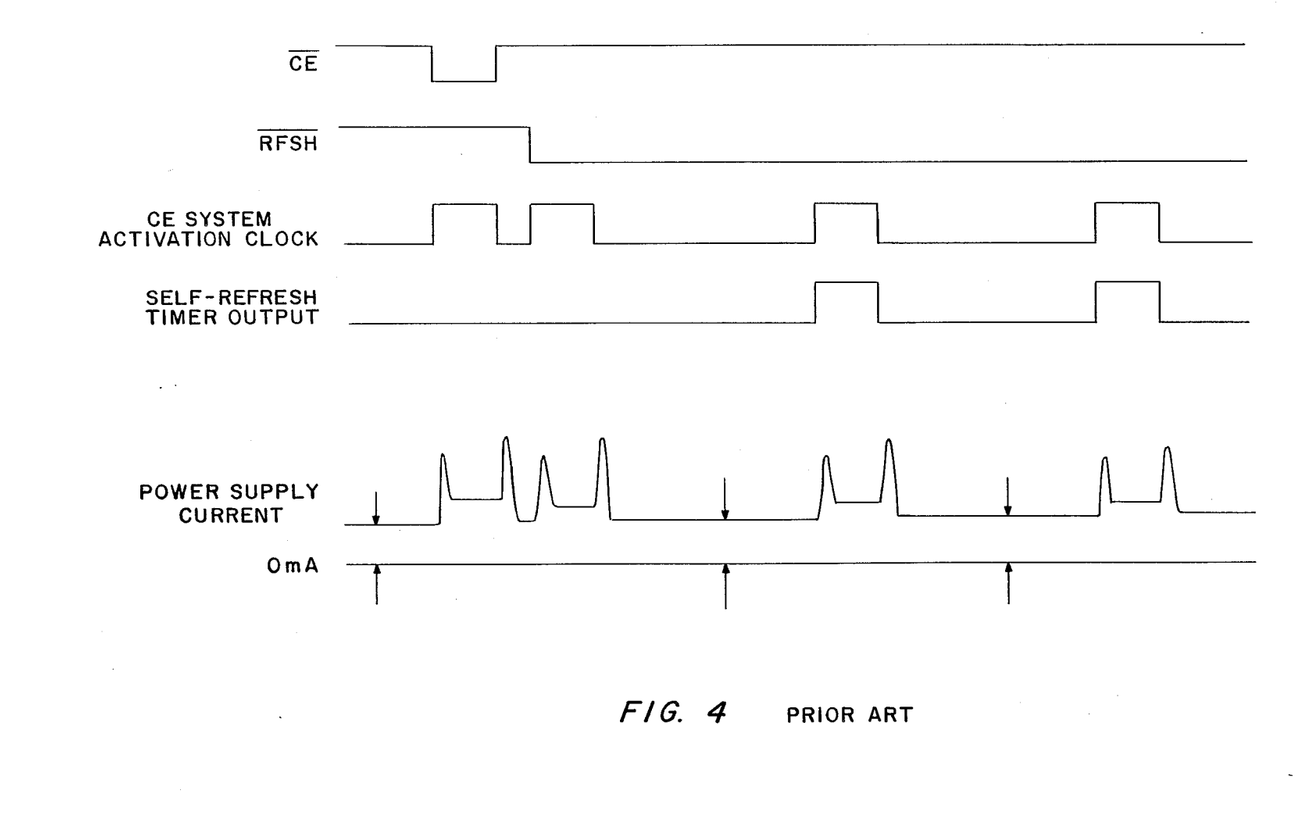
FIG. 4 shows the supply current waveforms appearing during the conventional memory cycle, pulse refreshing cycle and self-refreshing cycle, respectively.

FIG. 4 shows the supply current waveform obtained when memory cycle, pulse refreshing cycle, and self-refreshing cycle are successively performed. A standby supply current having a constant value flows through these cycles, and is overlapped with the steady-state and transient current portions for the active operation. The memory cycle and the pulse refreshing can be operated at a minimum cycle time according to specifications for aiming at high-speed operations.

On the other hand, the self-refreshing is simply performed periodically at such a period that is obtained by dividing the refresh interval by the refresh cycle number. Taking a 64 K bit-dynamic RAM as an example, the refresh interval is 2 mS and the refresh cycle number is 128. Therefore, the cycle time of the timer operation is as follows:

$$2 \text{ mS}/128 = 15.625 \text{ } \mu S$$

The width of the active period during the self-refreshing has a minimum general value of 120–150 nS, since the whole circuit is automatically returned to the reset/precharge state as soon as the internal refreshing operation is completed. Consequently, the value of the supply current during the self-refreshing cycle is substantially equal to that of the standby supply current.

The validity of the self-refreshing prevents the cell content from being lost simply by maintaining $\overline{RFSH}$ low potential. In other words, the dynamic RAM can be handled equally to a static RAM. Moreover, power consumption is reduced, because there is a low-speed time cycle operation, as well as a minimum active period width. The value of the present standby supply current is 3.5–5.0 mA for a 64K bit-dynamic RAM. The value of the supply current during the self-refreshing becomes substantially equal to the stand by current. That value is too large for the self-refreshing to be used in power down, and backup by means of a battery needs a value which is small as possible, below 1 mA in general.

According to the conventional circuit system, there is no possibility that the supply current can become smaller than the standby supply current. This is a problem in power down when the self-refreshing is mainly used.

Employed in the following description are all MOS transistors (referred to as "MOST" hereinafter), which are typical in insulated-gate field-effect transistors. Particularly, N channel MOSTs are preferred, wherein a high level is logic (1) and a low level is logic "0". From the viewpoint of a circuit, however, essentially the same design is used with P channel MOSTs.

Figure 6:
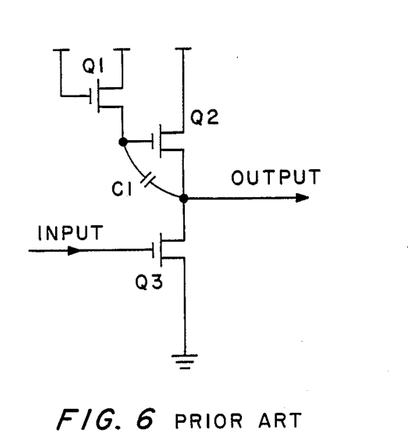
FIG. 6 shows the conventional basic circuit.

The inverter for supplying DC current is conventionally composed of MOSTs $Q_1$–$Q_3$ and a bootstrap capacitor $C_1$ of FIG. 6 and is employed as an inverter for converting external TTL level clock inputs (such as $\overline{CE}$, $\overline{RFSH}$ and the like) and an inverter for generating the first precharge timing signal. When the input shifts from a high level to a low level, the MOST $Q_3$ becomes nonconductive and the MOST $Q_2$ causes the output to start rising. The capacitor $C_1$ enables the MOST $Q_2$ to be placed in an unsaturated region, and the output rises to the supply level. With this as a starting point, the timing generating circuit can be actuated. On completion of the required operations, the input changes from low level to high level. At this time, the gate of the MOST $Q_2$ is constantly charged by the MOST $Q_1$ so as to conduct. The current capability of the MOST $Q_3$ must be made sufficiently larger than that of the MOST $Q_2$ and the output must be suppressed to be low and not to affect the subsequent stage by exceeding the low level or a threshold voltage. The DC current flows through the MOSTs $Q_2$ and $Q_3$ during that time.

The current capability of the MOST $Q_2$ must be minimized because it has a large effect on speed and directly affects the magnitude of the DC current. In the prior art, all the memory cycle, the pulse refresh cycle, and the self-refresh cycle are circuit operations at the same speed. The self-refresh current cannot be made smaller than the standby current even during the self-refresh cycle. The current cannot be made smaller as desired because the standby current is for required for obtaining a suitable operating speed.

Figure 7A:
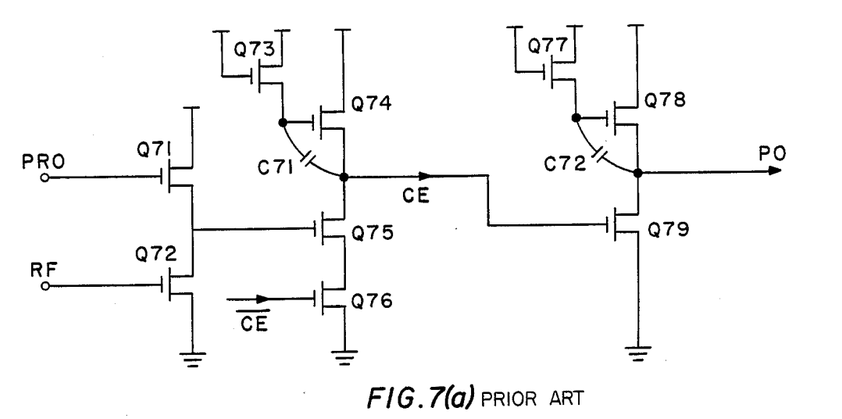
FIGS. 7(a) and 7(b) show a practical example of a conventional timing generating circuit which consumes DC current.
Figure 7B:
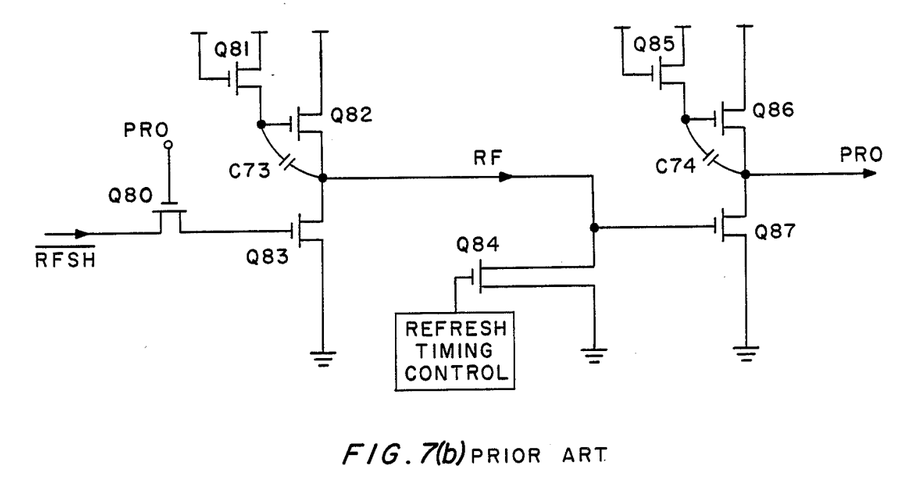

A practical circuit for supplying the standby DC current in the conventional RAM will be described hereinunder with reference to FIG. 7. FIG. 7 shows prior art portions, which consume DC current, in the timing generating circuit for receiving the external clock inputs $\overline{CE}$ (FIG. 7(a) and $\overline{RFSH}$ (FIG. 7(b)). During the general memory cycle, $\overline{RFSH}$ is in an inactive state, i.e., at high level, and an activation timing signal RF is at a low while a pre-charge timing signal PR0 is high. Consequently, a MOST $Q_{75}$ is conductive because the gate thereof is charged with a MOST $Q_{71}$. When signal $\overline{CE}$ shifts from a high level to a low level, a MOST $Q_{76}$ is made nonconductive. Signal CE rises and reaches the supply level by means of a bootstrap capacitor $C_{71}$. A MOST $Q_{79}$ is made conductive, and P0 shifts to low level. Subsequently, the basic clock generating circuit operates, and a read or write cycle starts. On completion of this cycle, signal $\overline{CE}$ is returned to a high level, and the circuit is reset to the standby state where signal CE is low level and signal P0 is a supply level.

As will be understood from the above, DC current flows through MOSTs $Q_{74}$ and $Q_{82}$ under the standby state and through MOSTs $Q_{78}$ and $Q_{82}$ during the period of time while the memory cycle is active. When signal $\overline{RFSH}$ is shifted from a high level to a low level, with signal $\overline{CE}$ maintained high, a MOST $Q_{83}$ is made nonconductive through a MOST $Q_{80}$. When signal RF rises to reach the supply level, PR0 shifts to low level in response thereto. As a result, the MOST $Q_{75}$ is made nonconductive since its gate is at the ground potential. Signal CE rises while P0 shifts to low level, so that a refreshing operation is performed on the word line designated by the refresh address counter.

On completion of the refreshing operation, signal RFEND rises, and a MOST $Q_{84}$ is made conductive through the refresh timing control block, so that signals RF and PR0 are automatically reset to a low level and the supply level respectively. If $\overline{RFSH}$ is maintained at a low level, as it is, the timer operates, starting the self-refreshing as described above. In other words, in response to a rise in the timer output, the output of the refresh timing control circuit becomes a low level, and the MOST $Q_{84}$ is made nonconductive. Consequently, the signal RF rises, while signal PR0 shifts to low level. The refreshing operation is started in a similar manner.

On completion of the operation, the RFEND signal rises, causing the MOST $Q_{84}$ to become conductive and to automatically return the circuit to the reset state. Thereafter, the operation is repeated as signal long as $\overline{RFSH}$ is at a low level. In these pulse refreshing and self-refreshing, DC current flows through the MOSTs $Q_{78}$ and $Q_{86}$ during the active period and through the MOSTs $Q_{74}$ and $Q_{82}$ during the reset/precharge period.

Figure 8:
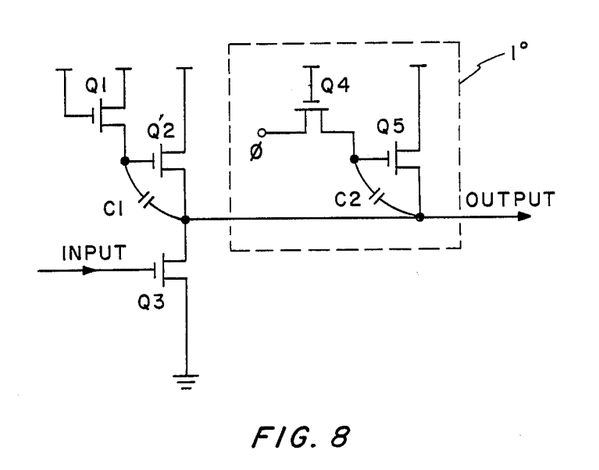
FIG. 8 shows the basic circuit configuration according to the invention.

FIG. 8 shows the basic arrangement of a dynamic random-access memory according to the invention.

The inverter for receiving external input signals is arranged as shown in FIG. 8 according to the invention.

In other words, provided as a bootstrap load driven by the capacitance $C_1$ is a MOST $Q_2'$ having a current supply capability which is smaller than the MOST $Q_2$ of FIG. 6. Moreover provided in parallel with the load is a load circuit 10 driven by a clock signal $\phi$ generated during the memory cycle or pulse refreshing. In this case, the current supply capability of the MOST $Q_2'$ is made smaller, to such an extent that it can still carry out the required self-refresh cycle. The load transistor of the load circuit 10 has a current supply capability which is large enough to perform the memory cycle and the pulse refreshing. A MOST $Q_4$ and a capacitance $C_2$ in the load circuit 10 constitute a bootstrap circuit for driving a MOST $Q_5$ into the unsaturated region.

The clock signal $\phi$ is set to be maintained at the supply level during the memory cycle, and the pulse refresh cycle but to shift to a low level when the timer output is activated to start the self-refresh cycle. During the memory cycle and the pulse refresh cycle, when the input changes from a high level to a low level, both the MOSTs $Q_2'$ and $Q_5$ drive the output and are brought into the unsaturated region by means of the capacitors $C_1$, $C_2$ respectively so that the output rises to the supply level. When the input becomes a high level, the MOST $Q_3$ is made conductive and the output must be at a level which is sufficiently lower than a threshold voltage. The current capability of the MOST $Q_3$ must be sufficiently larger than the sum of the current capabilities of the MOSTs $Q_2'$ and $Q_5$.

The clock signal $\phi$ is lowered in its level during the self-refreshing, since there is no need for high-speed operations such as are required in the memory cycle and the pulse refresh cycle. The MOST $Q_5$ is made nonconductive, so that it cannot drive the output. The output is driven by the MOST $Q_2'$ and the operation is the same as the conventional circuit operation.

It is, however, possible to decrease the current capability of the MOST $Q_2'$ within the operation limits of the timing generating circuit and the range allowed by the self-refresh cycle time. Consequently, the high-speed operations during the memory cycle and the pulse refresh cycle are obtained by making the current capability of the MOST $Q_5$ the same as the prior art. When the MOST $Q_5$ drives the output, the MOST $Q_2'$ does not substantially contribute to the drive. At this time, the source diffusion capacitance of the MOST $Q_2'$ is small and both ends of the capacitor $C_1$ have the same level. The arrangement has such an advantage that this is not a load with respect to the MOST $Q_5$, so that there is no possibility of interference with the high-speed operation.

Figure 5:
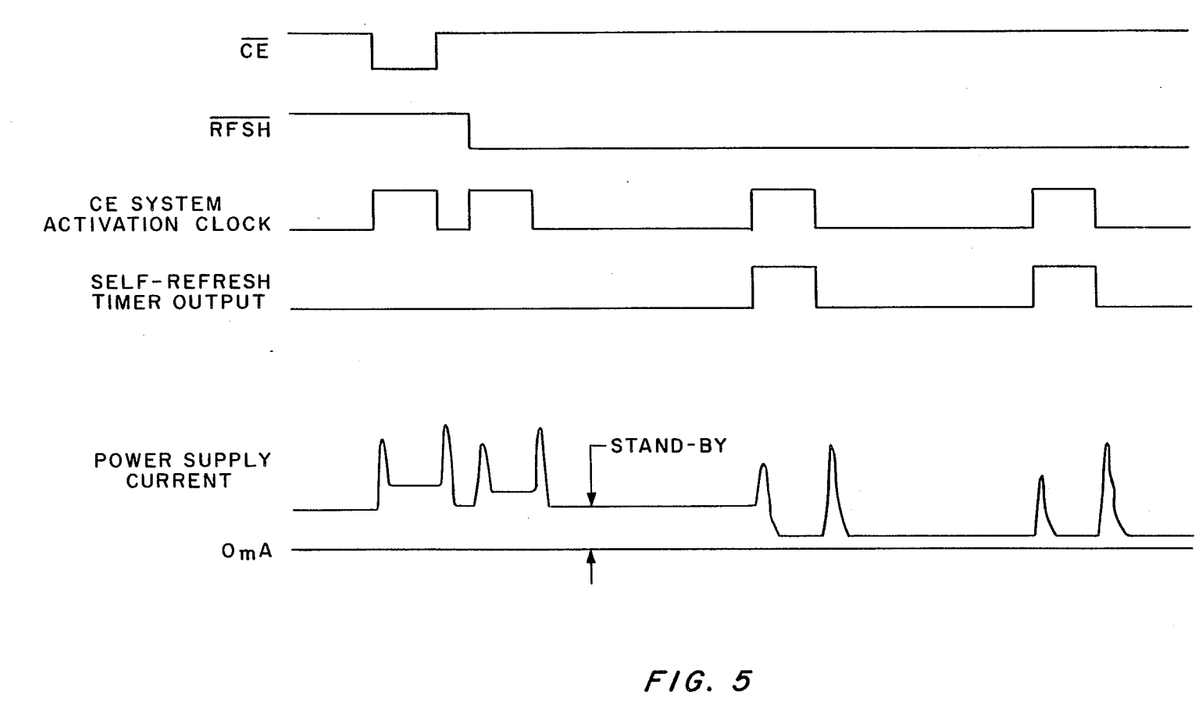
FIG. 5 shows the supply current waveform in a memory according to the invention, corresponding to those of FIG. 4.

The supply current wave forms during the memory cycle, the pulse refresh cycle and the self-refresh cycle in the semiconductor memory according to the invention are practically shown in FIG. 5. Although the wave forms during the first two cycles are the same, when the self-refreshing is started in response to the timer output, the DC current portion decreases during both the active period and the reset precharge period. As the result of this, it becomes possible to make the supply current during the self-refreshing smaller than the standby supply current.

Figure 9A:
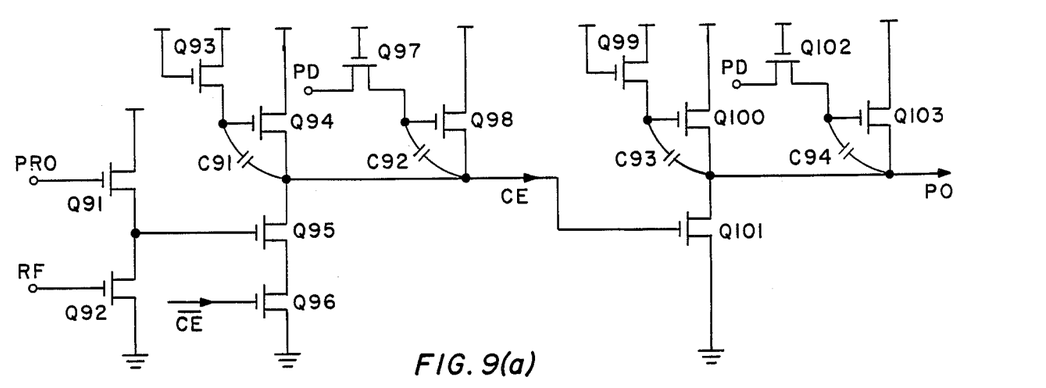
FIGS. 9(a), 9(b), and 9(c) show a circuit obtained by applying the invention to the circuit of FIG. 8, as a preferred embodiment of the invention in a practical form.
Figure 9B:
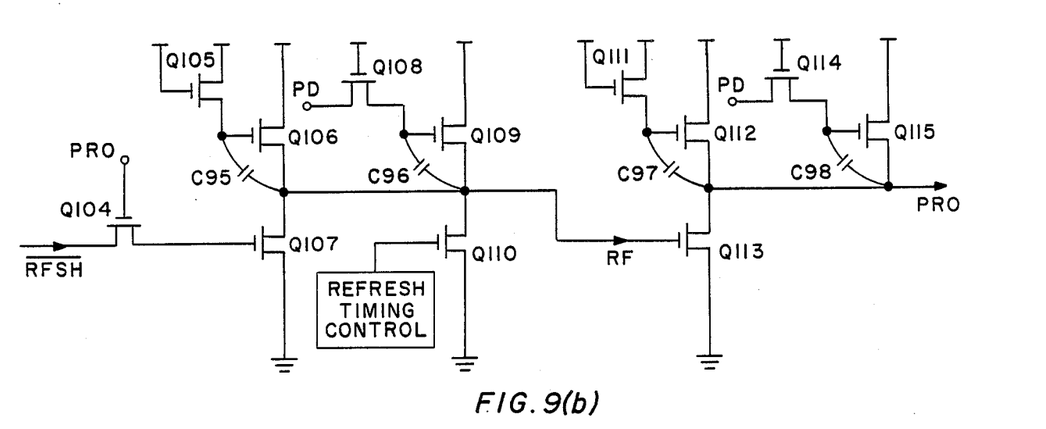
Figure 9C:
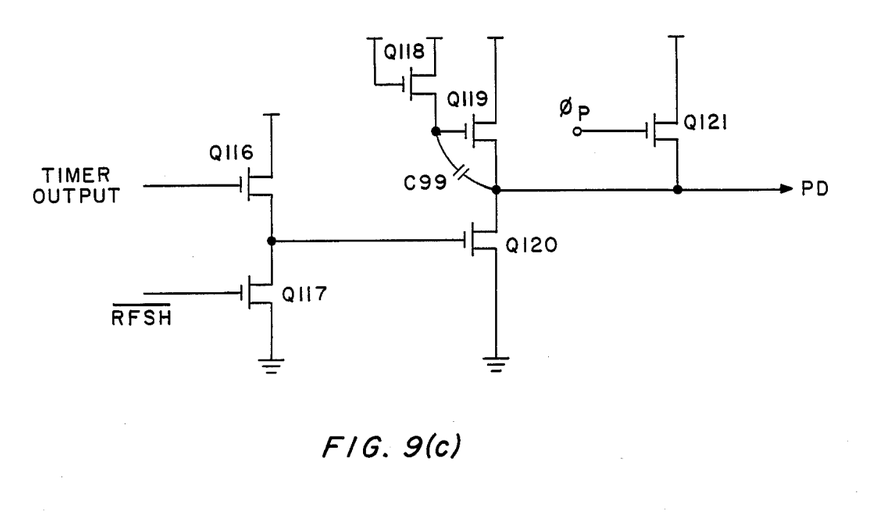
Figure 10:
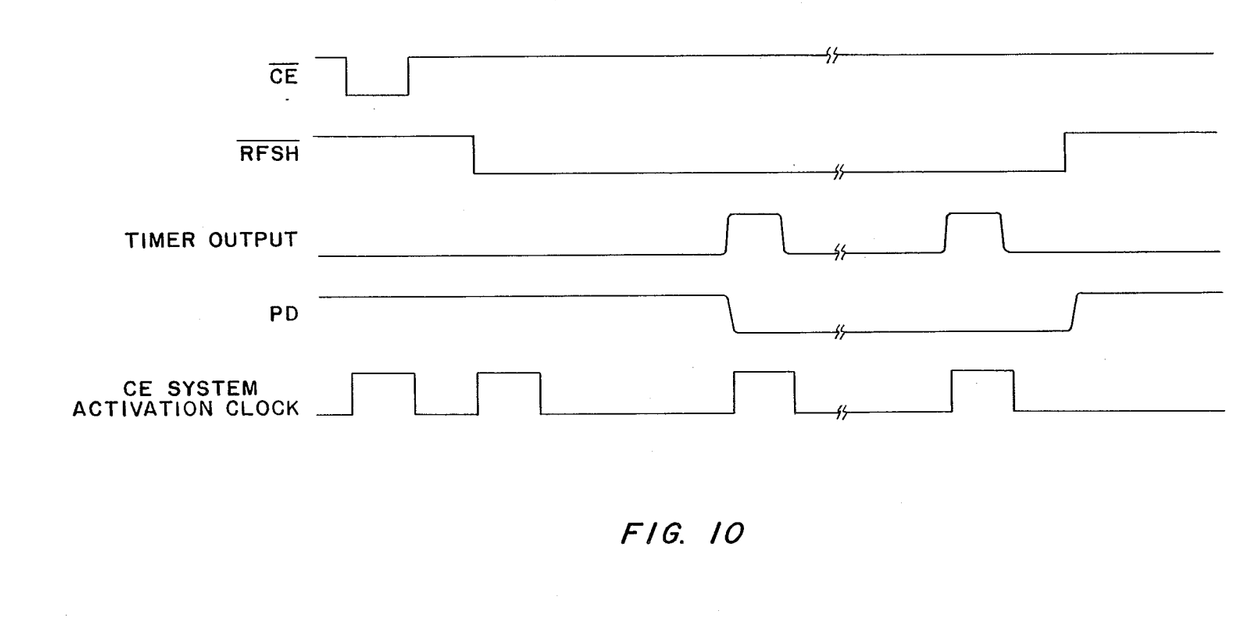
FIG. 10 shows the timing waveforms of the circuit of FIG. 9.

FIG. 9 shows a preferred embodiment of a RAM to which the invention is applied. FIG. 10 shows the timing waveforms thereof.

FIG. 9(a) shows a CE series circuit which receives the chip enable signal $\overline{CE}$ and generates an internal chip enable signal CE by inverting $\overline{CE}$, and a pre-charge signal PO by inverting the CE. In this circuit structure, two stages of inverters are employed in cascade.

In FIG. 9(b), a refresh series circuit as shown. This circuit is composed of two stages of inverters connected in cascade. Namely, a first stage of inverter including MOSTs $Q_{104}$ to $Q_{110}$ receives the refresh control signal $\overline{RFSH}$ from the outside and generates an internal refresh control signal RF. A second stage of inverter composed of MOSTs $Q_{111}$ to $Q_{115}$ receives the signal RF to generates a pre-charge signal PRO. FIG. 9(c) shows a circuit structure for generating a timing signal PD for controlling power down in the four inverters of FIG. 9(a) and (b). In this circuit, the signal $\overline{RFSH}$ and an output signal from a timer circuit (e.g. 19 of FIG. 1) are applied to gates of MOSTs $Q_{116}$ and $Q_{117}$ in an input stage.

MOSTs $Q_{98}$, $Q_{103}$, $Q_{109}$ and $Q_{115}$ guarantee the high-speed operations during the memory cycle and the pulse refresh cycle. There is a need for proper current capabilities. When the timer output rises to start the self-refresh cycle, a MOST $Q_{116}$ is made conductive, and since $\overline{RFSH}$ is low and a MOST $Q_{117}$ is nonconductive, the gate of a MOST $Q_{120}$ is charged, so that it is made conductive. The timing signal PD for power down shifts to a low level. The MOSTs $Q_{98}$, $Q_{103}$, $Q_{109}$ and $Q_{115}$, having worked and been conductive during the memory cycle, and the pulse refresh cycle are made nonconductive. In place of them, MOSTs $Q_{94}$, $Q_{100}$, $Q_{106}$ and $Q_{112}$ are made conductive to drive the output. In this case, since the cycle time is sufficiently long, it is possible to lower the current capabilities within a range such that the basic clock generating circuit and the internal refreshing clock generating circuit are operated, to obtain a normal refreshing operation. The MOST $Q_{120}$ is maintained conductive while the PD signal is kept at low level during the period of time: the first timer output rises, the self-refreshing is completed, and $\overline{RFSH}$ is returned to high level. The current capability of the MOST $Q_{119}$ can be lowered to correspond to the current value required during the self-refreshing, since no high-speed operation is necessary for the signal PD, although DC current flows through the MOST $Q_{119}$.

In the circuit of FIG. 9, DC current flows through the MOST $Q_{100}$, $Q_{112}$, and $Q_{119}$ during the active period in the self-refreshing and through the MOSTs $Q_{94}$, $Q_{106}$ and $Q_{119}$ during the reset precharge period. The DC portion of this current, however, becomes exceedingly smaller than those current which flow during the memory cycle and the pulse refresh cycle, since the current capabilities can be all made sufficiently small as described above. There is no change in the transient current portion in the refreshing operation. Therefore, the largest current component in the self-refresh cycle is the transient current portion. The value is about 0.4 mA at the present 64K bit-dynamic RAM level, so that it is possible to suppress the supply current during the self-refreshing, to be below a standard of 1 mA including the above-mentioned DC portion. This current is one-fifth as compared with the standby current of 3.5–5.0 mA. When the $\overline{RFSH}$ signal is returned to a high level in order to finish the self-refresh cycle, the MOST $Q_{120}$ becomes nonconductive, and PD is restored to the supply level as shown in FIG. 10, to prepare for the subsequent memory cycle. The supply level of signal PD is refreshed with the MOST $Q_{121}$ by using the basic clock timing signal $\phi_p$ whose high level is above the supply level.

As will be fully understood from the foregoing description, according to the invention, it is possible to obtain a dynamic RAM with an internal refresh function such that the supply current during the self-refreshing can be reduced to about one-fifth the standby current during the general memory cycle, together with a circuit system for realizing the same, the dynamic RAM being exceedingly effective to use in power down.

I claim:

1. A dynamic memory comprising a memory array of memory cells arranged in rows and columns, row address means for receiving a set of row address signals, first means for receiving a refresh control signal having first and second logic levels, a refresh address counter for operatively designating a row address to be refreshed in response to said first level of said refresh control signal, row decoding means coupled to said row address means and to said refresh address counter for operatively selecting one of said rows to refresh the memory cells coupled to the selected row, said row decoding means being adapted to take in the contents of said refresh address counter in response to said first level of said refresh control signal and take in the row address signals received by said receiving means in response to said second level of said refresh control signal, said first means including first and second series circuits of an input switching means and a load circuit, the input switching means of said first series circuit receiving said refresh control signal, the input switching means of said second series circuit receiving an output of said first series circuit, the input switching means of one of said first and second series circuits assuming a conductive state in response to said first level of said refresh control signal to cause a current flow through the load circuit, and a current control circuit for operatively decreasing an amount of current flowing through said load circuit of at least said one of said first and second series circuits in response to said first level of said refresh control signal.

2. The memory device according to claim 1, in which said load circuit of at least said one of said first and second series circuits includes a first field effect transistor, means for continuously biasing said first transistor into a conductive state and a second field effect transistor connected in parallel with said first transistor and having a smaller resistance than said first transistor, said second transistor being adapted to assume conductive and non-conductive states in response to said second and first levels of said refresh control signal, respectively.

3. The memory device according to claim 1, further comprising means for receiving a chip enable signal, and clock generating means for generating a clock signal for controlling operation of said memory array, said clock generating means includes a series circuit comprising first and second transistors coupled between a reference potential and an output node, said first transistor assuming a conductive state when said chip enable signal is at an inactive state, said second transistor assuming a conductive state when said refresh control signal is at said first level, first and second load transistors coupled between said output node and a power voltage, means for continuously placing said first load transistor in a conductive state, and means for placing said second load transistor in a conductive state when said refresh control signal assumes said first level.

4. A dynamic memory comprising an array of dynamic memory cells arranged in rows and columns, a first terminal for receiving a refresh control signal having first and second logic levels, address input means for receiving a set of address signals, an internal address generating circuit for operatively generating refresh address information, a second terminal for receiving a chip enable signal having third and fourth logic levels, an internal clock signal generator coupled to said first and second terminals for operatively generating a series of clock signals, a refresh circuit coupled to said array, said refresh circuit being responsive to said clock signals to refresh the memory cells of the selected row by said set of address signals when said refresh control signal is at said first logic level and said chip enable signal is at said third logic level and refreshing the memory cells of the designated row by said refresh address information when said refresh control signal is at said second logic level and said chip enable signal is at said fourth logic level, said internal clock signal generator generating said series of clock signals at a first cycle time when said refresh control signal is at said first logic level and said chip enable signal is at said third logic level and at a second cycle time when said refresh control signal is at said second logic level and said chip enable signal is at said fourth logic level, said second cycle time being longer than said first cycle.

5. The memory according to claim 4, in which said clock signal generator including a first series circuit of a first input transistor and a load circuit, said load circuit having first and second load transistors connected in parallel, said first input transistor receiving said refresh control signal, means for continuously placing said first load transistor in a conductive state, and a control means for operatively making said second load transistor conductive when said refresh control signal is at said first logic level.

6. The memory according to claim 5, in which a resistance of said first load transistor is larger than the resistance of said second transistor.

7. A semiconductor circuit comprising: a first field-effect transistor having a drain-source current path coupled between a first power terminal and a first node and having a gate connected to a second node; means for continuously placing said first transistor in a conductive state; a first capacitor having a first terminal connected to said second node and a second terminal connected to said first node; a second field effect transistor having its drain-source current path coupled between said first node and a second power terminal and having a gate for receiving a first signal; a third field effect transistor with its drain-source current path coupled between said first power terminal and said first node and having a gate connected to a third node; a fourth field effect transistor with its drain-source current path coupled between a fourth node for receiving a second signal and said third node and having a gate connected to said first power terminal; and a second capacitor having a first terminal connected to said third node and a second terminal connected to said first node, said second signal being maintained at an active level during normal operations and said first node being driven by said first and third transistors in order to generate with a relatively high speed an output signal having an opposite-phase as compared to the phase of said first signal at said first node while in a power down mode, said second signal being maintained at an inactive level, and said third transistor being made non-conductive in order to drive said first node by means of said first transistor, thereby enabling said opposite-phase output signal to be generated with a relatively slow speed at said first node.

8. The circuit according to claim 7, in which a resistance of said first transistor is larger than the resistance of said third transistor.

9. A semiconductor circuit comprising a logic section including at least one logic input transistor, a first load circuit connected in series with said logic section, a second load circuit connected in series with said logic section and in parallel with said first load circuit, means for supplying a first logic signal to said logic input transistor, control means responsive to a second logic signal for enabling said second load circuit, and means for continuously enabling said first load circuit, wherein an amount of a current flowing to said logic section is controlled between two different values in response to said second logic signal.

10. The semiconductor circuit according to claim 9, in which said second logic signal is independent of said first logic signal.

11. The semiconductor circuit according to claim 9, in which said second logic signal is derived from said first logic signal.

12. The semiconductor circuit according to claim 9, in which said second load circuit includes a first transistor coupled between a power voltage terminal and said logic section, and a second transistor coupled between the gate of said first transistor and a first node to which said second logic signal is applied.

13. A semiconductor circuit comprising means for receiving a control signal, a series circuit of a logic section and load section, an output terminal coupled to the intermediate junction of said series circuit, said logic section having an input transistor for receiving a logic signal, said load section including a control terminal for changing between first and second values an amount of current flowing therethrough, and means coupled to said control terminal for controlling said load section in response to said control signal.

14. The semiconductor circuit according to claim 13, in which said load section includes first and second load transistors connected in parallel, a third transistor coupled between the gate of said second load transistor and said control terminal, and means for placing said first load transistor in a conductive state.

15. A semiconductor circuit comprising a switching means responsive to an input signal for attaining a switching operation, a first load having a first resistance, means for permanently connecting said first load to said switching means, a second load having a second resistance, and control means coupled to said second load for connecting said second load to said switching means during a first period of time when the switching operation of said switching means is done two or more times and for disconnecting said second load from said switching means during a second period of time which is different from said first period of time.

16. The semiconductor circuit according to claim 15, in which said first resistance is higher than said second resistance.

17. A method for retaining data stored in a dynamic memory provided with a clock generator, said method comprising the steps of:
(a) setting said memory in an access mode to cause a first amount of current through at least two parallel connected load means for generating clock signals at a relatively high speed;
(b) performing read or write operations for the memory cells selected by address input signals in response to said clock signals generated at a relatively high speed;
(c) setting said memory in self-refresh mode to cause a second amount of current through only one of said load means for generating clock signals at a relatively slow speed, said second amount of current being less than said first amount of current; and
(d) refreshing the memory cells sequentially in response to said clock signals generated at a relatively slow speed.

* * * * *